(12) United States Patent
Itokazu et al.

(10) Patent No.: US 11,502,074 B2
(45) Date of Patent: Nov. 15, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroko Itokazu, Kawasaki Kanagawa (JP); Tomoko Matsudai, Tokyo (JP); Yoko Iwakaji, Tokyo (JP); Takako Motai, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/986,764

(22) Filed: Aug. 6, 2020

(65) Prior Publication Data
US 2021/0296310 A1    Sep. 23, 2021

(30) Foreign Application Priority Data
Mar. 19, 2020 (JP) .............................. JP2020-049917

(51) Int. Cl.
*H01L 27/07* (2006.01)
*H01L 29/06* (2006.01)
*H01L 29/739* (2006.01)

(52) U.S. Cl.
CPC ...... *H01L 27/0716* (2013.01); *H01L 29/0626* (2013.01); *H01L 29/0696* (2013.01); *H01L 29/7397* (2013.01)

(58) Field of Classification Search
CPC ............ H01L 27/0716; H01L 29/0626; H01L 29/0696; H01L 29/7397; H01L 29/0603;
(Continued)

(56) References Cited

U.S. PATENT DOCUMENTS 9,159,721 B2   10/2015   Okawara et al.
9,159,722 B2   10/2015   Ogura et al.
(Continued)

FOREIGN PATENT DOCUMENTS

JP    2014-112637 A    6/2014
JP    2015-09341 A    1/2015
(Continued)

*Primary Examiner* — Shouxiang Hu
(74) *Attorney, Agent, or Firm* — Allen & Overy LLP

(57) ABSTRACT

A semiconductor device includes a semiconductor part, first and second electrodes, and a control electrode. The semiconductor part is provided between the first and second electrodes. The control electrode is provided in a trench of the semiconductor part between the semiconductor part and the second electrode. The semiconductor part includes first to third layers. The first layer of a first conductivity type extends between the first and second electrodes. The second layer of a second conductivity type is provided between the first layer and the second electrode. The second layer is connected to the second electrode. The third layer of the second conductivity type is provided between the second layer and the control electrode. The third layer includes a second-conductivity-type impurity with a higher concentration than a second-conductivity-type impurity of the second layer. The third layer contacts the second electrode, and is electrically connected to the second electrode.

12 Claims, 7 Drawing Sheets

(58) Field of Classification Search
CPC ............... H01L 29/0623; H01L 29/407; H01L 29/7391; H01L 29/8613; H01L 27/0727; H01L 29/739; H01L 29/06; H01L 29/861; H01L 29/78; H01L 29/872; H01L 21/336; H01L 29/08; H01L 29/36; H01L 29/868; H01L 29/47; H01L 29/00; H01L 29/417
See application file for complete search history.

(56) References Cited

U.S. PATENT DOCUMENTS

| | | |
|---|---|---|
| 9,876,011 B2 | 1/2018 | Matsushita et al. |
| 2014/0124832 A1 | 5/2014 | Ogura et al. |
| 2015/0000488 A1 | 1/2015 | Yanagawa et al. |
| 2015/0263148 A1 | 9/2015 | Ogura et al. |
| 2015/0295042 A1* | 10/2015 | Kameyama ......... H01L 29/7397 257/140 |
| 2016/0351562 A1* | 12/2016 | Senoo ................ H01L 27/0727 |
| 2017/0077089 A1 | 3/2017 | Ogura et al. |

FOREIGN PATENT DOCUMENTS

| | | |
|---|---|---|
| JP | 2015-177058 A | 10/2015 |
| JP | 5918288 B2 | 5/2016 |
| JP | 2017-055079 A | 3/2017 |
| JP | 2017-103456 A | 6/2017 |
| JP | 6158058 B2 | 7/2017 |

\* cited by examiner

SEMICONDUCTOR DEVICE

CROSS-REFERENCE TO RELATED APPLICATIONS

This application is based upon and claims the benefit of priority from Japanese Patent Application No. 2020-049917, filed on Mar. 19, 2020; the entire contents of which are incorporated herein by reference.

FIELD

Embodiments relate to a semiconductor device and a method for controlling the same.

BACKGROUND

It is desirable to reduce the switching loss of a power semiconductor device. For example, in a power conversion circuit with an IGBT (Insulated Gate Bipolar Transistor) and a diode, it is desirable for the diode to reduce the recovery loss when transitioning from the on-state to the off-state.

DETAILED DESCRIPTION

Figure 1:
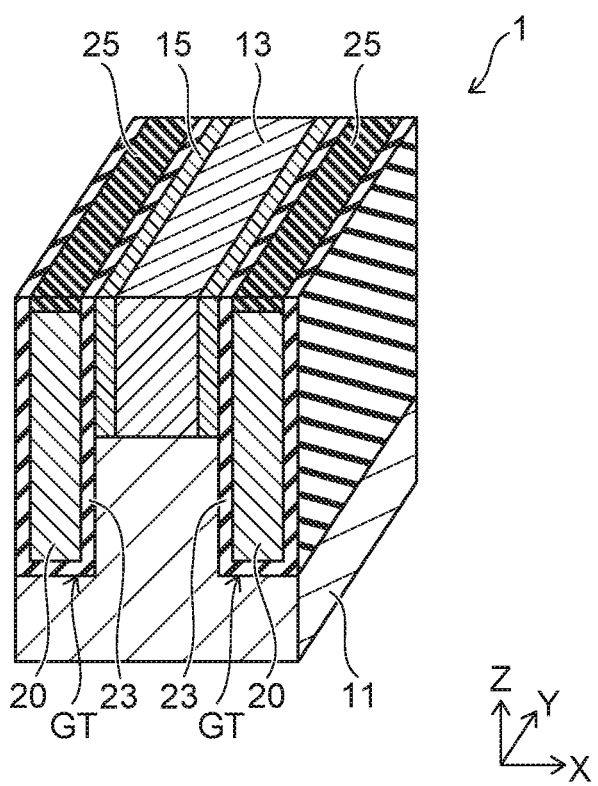
FIG. 1 is a perspective view schematically showing a semiconductor device 1 according to an embodiment.

According to one embodiment, a semiconductor device includes a semiconductor part, first and second electrodes and a control electrode. The semiconductor part includes a trench at a front surface side. The first electrode is provided on a back surface of the semiconductor part, and the second electrode is provided on the front surface of the semiconductor part. The control electrode is provided in the trench of the semiconductor part between the semiconductor part and the second electrode. The control electrode is electrically insulated from the semiconductor part by a first insulating film and electrically insulated from the second electrode by a second insulating film. The semiconductor part includes a first semiconductor layer of a first conductivity type, a second semiconductor layer of a second conductivity type, and a third semiconductor layer of the second conductivity type. The first semiconductor layer extends between the first and second electrodes. The control electrode extends into the first semiconductor layer from the front surface side of the semiconductor part. The second semiconductor layer is provided between the first semiconductor layer and the second electrode. The second semiconductor layer is connected to the second electrode. The third semiconductor layer is provided between the second semiconductor layer and the control electrode. The third semiconductor layer contacts the first insulating film and the second semiconductor layer. The third semiconductor layer includes a second-conductivity-type impurity with a higher concentration than a concentration of a second-conductivity-type impurity in the second semiconductor layer. The third semiconductor layer contacts the second electrode, and is electrically connected to the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a semiconductor device 1 according to an embodiment. The semiconductor device 1 is, for example, a diode with a trench gate structure. The trench gate structure shown in FIG. 1 is an example, and the embodiment is not limited thereto. For example, the anode electrode and the gate electrode may be configured to be electrically connected.

The semiconductor device 1 includes a semiconductor part 10 (referring to FIG. 2A) and a control electrode 20. The semiconductor part 10 includes an n-type semiconductor layer 11, a p-type semiconductor layer 13, and a p-type semiconductor layer 15. The semiconductor part 10 is, for example, silicon.

The control electrode 20 is disposed inside a gate trench GT provided in the semiconductor part 10. The control electrode 20 extends into the n-type semiconductor layer 11 from the front surface side of the semiconductor part 10. The control electrode 20 is electrically insulated from the semiconductor part 10 by an insulating film 23. For example, the upper end of the control electrode 20 is covered with an insulating film 25. The control electrode 20 is, for example, conductive polysilicon. The insulating film 23 and the insulating film 25 are, for example, silicon oxide films.

Multiple control electrodes 20 are provided. The p-type semiconductor layer 13 is provided on the n-type semiconductor layer 11. The p-type semiconductor layer 13 is provided between two mutually-adjacent control electrodes 20 of the multiple control electrodes 20. The p-type semiconductor layer 13 is formed by ion-implanting a p-type impurity such as boron (B) into the front surface side of the semiconductor part 10.

The p-type semiconductor layer 15 is provided on the n-type semiconductor layer 11. The p-type semiconductor layer 15 is provided between the p-type semiconductor layer 13 and the control electrode 20. The p-type semiconductor layer contacts the n-type semiconductor layer 11 and the insulating film 23. The p-type semiconductor layer 15 faces the control electrode 20 via the insulating film 23. The p-type semiconductor layer 15 includes a p-type impurity with a higher concentration than the concentration of the p-type impurity in the p-type semiconductor layer 13.

The p-type semiconductor layer 15 is formed by ion-implanting a p-type impurity such as boron (B) into the inner wall of the gate trench GT and by activating the p-type impurity. For example, the p-type impurity can be ion-implanted into the upper portion of the gate trench GT by controlling the incident angle with respect to the front surface of the semiconductor part 10.

As shown in FIG. 1, for example, the lower end of the p-type semiconductor layer 13 is positioned at substantially the same level in the Z-direction as the boundary between the n-type semiconductor layer 11 and the p-type semiconductor layer 15. For example, the thickness in the Z-direction of the p-type semiconductor layer 13 is substantially equal to the length in the Z-direction of the p-type semiconductor layer 15.

For example, the lower end of the p-type semiconductor layer 13 may be positioned at a lower level in the Z-direction than the boundary between the n-type semiconductor layer 11 and the p-type semiconductor layer 15. In other words, the p-type semiconductor layer 13 faces the insulating film 23 via the p-type semiconductor layer 15. For example, the p-type semiconductor layer 15 has a narrower width than the width of the p-type semiconductor layer 13 in the direction (the X-direction) from the p-type semiconductor layer 13 toward the control electrode 20. The width of the p-type semiconductor layer 15 in the X-direction is less than the length of the p-type semiconductor layer 15 along the insulating film 23 in the Z-direction.

Moreover, there are also cases where the lower end of the p-type semiconductor layer 15 is positioned at a higher level in the Z-direction than the boundary between the n-type semiconductor layer 11 and the p-type semiconductor layer 13. For example, other than the portion of the p-type semiconductor layer 13 positioned at the vicinity of the n-type semiconductor layer 11, the p-type semiconductor layer 13 faces the insulating film 23 via the p-type semiconductor layer 15.

Figure 2A:
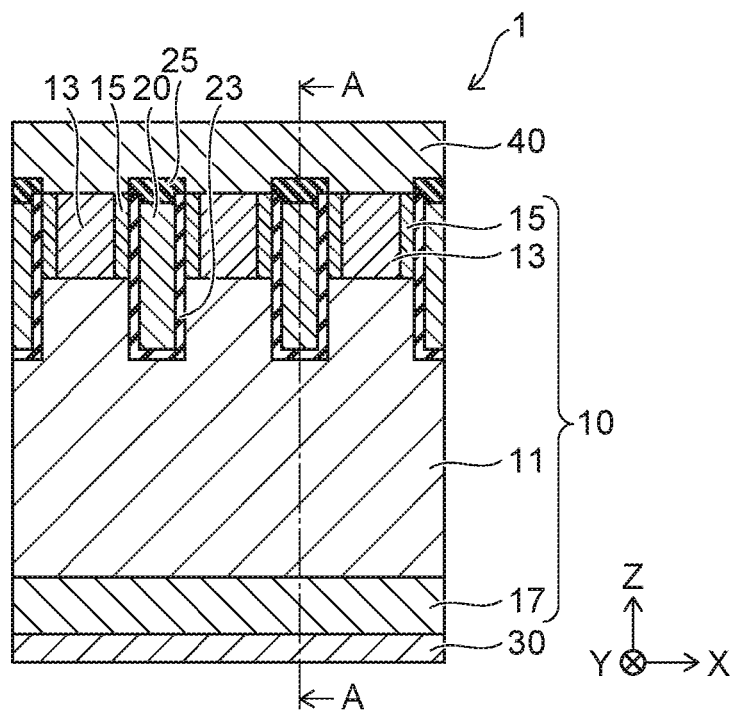
FIGS. 2A and 2B are schematic cross-sectional views showing the semiconductor device according to the embodiment.
Figure 2B:
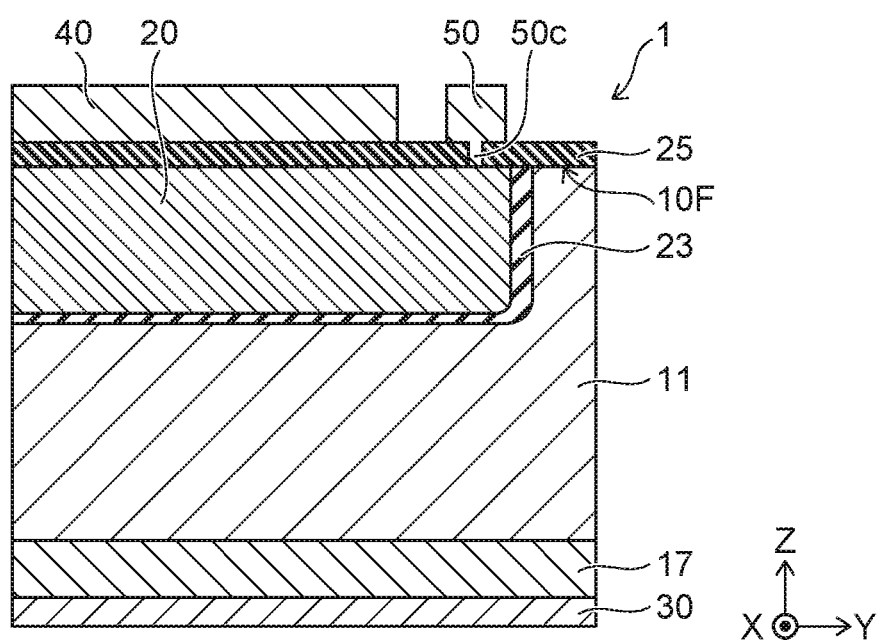

FIGS. 2A and 2B are schematic cross-sectional views showing the semiconductor device 1 according to the embodiment. FIG. 2A is a schematic view showing a cross section parallel to the X-Z plane. FIG. 2B is a cross-sectional view along line A-A shown in FIG. 2A.

As shown in FIG. 2A, the semiconductor part 10 is provided between a first electrode 30 and a second electrode 40. The first electrode 30 is, for example, a cathode electrode provided on the back surface of the semiconductor part 10. The second electrode 40 is, for example, an anode electrode provided on the front surface of the semiconductor part 10. The first electrode 30 and the second electrode 40 are, for example, metal layers including titanium (Ti) and aluminum (Al).

The control electrode 20 is electrically insulated from the semiconductor part 10 by a gate insulating film (i.e., the insulating film 23). Also, the control electrode 20 is electrically insulated from the second electrode 40 by the insulating film 25.

The second electrode 40 is connected to the p-type semiconductor layer 13 and the p-type semiconductor layer 15. The second electrode 40 has, for example, a Schottky connection with the p-type semiconductor layer 13. The second electrode 40 has, for example, an ohmic connection with the p-type semiconductor layer 15.

The semiconductor part 10 further includes an n-type semiconductor layer 17. The n-type semiconductor layer 17 is provided between the n-type semiconductor layer 11 and the first electrode 30. The first electrode 30 is electrically connected to the n-type semiconductor layer 17. The n-type semiconductor layer 17 includes an n-type impurity with a higher concentration than the concentration of the n-type impurity in the n-type semiconductor layer 11.

As shown in FIG. 2B, for example, the control electrode extends in the Y-direction along the front surface 10F of the semiconductor part 10. The control electrode 20 is electrically connected to a gate interconnect 50. The gate interconnect 50 includes, for example, a connection portion 50c. The connection portion 50c extends through a contact hole provided in the insulating film 25 and is connected to the control electrode 20. For example, the gate interconnect 50 is connected to a gate pad (not-illustrated). The control electrode 20 is not limited to the example. For example, there may be a structure without the gate interconnect 50 and the gate pad, where the control electrode 20 is electrically connected to the second electrode 40 (i.e., the anode electrode).

Figure 3A:
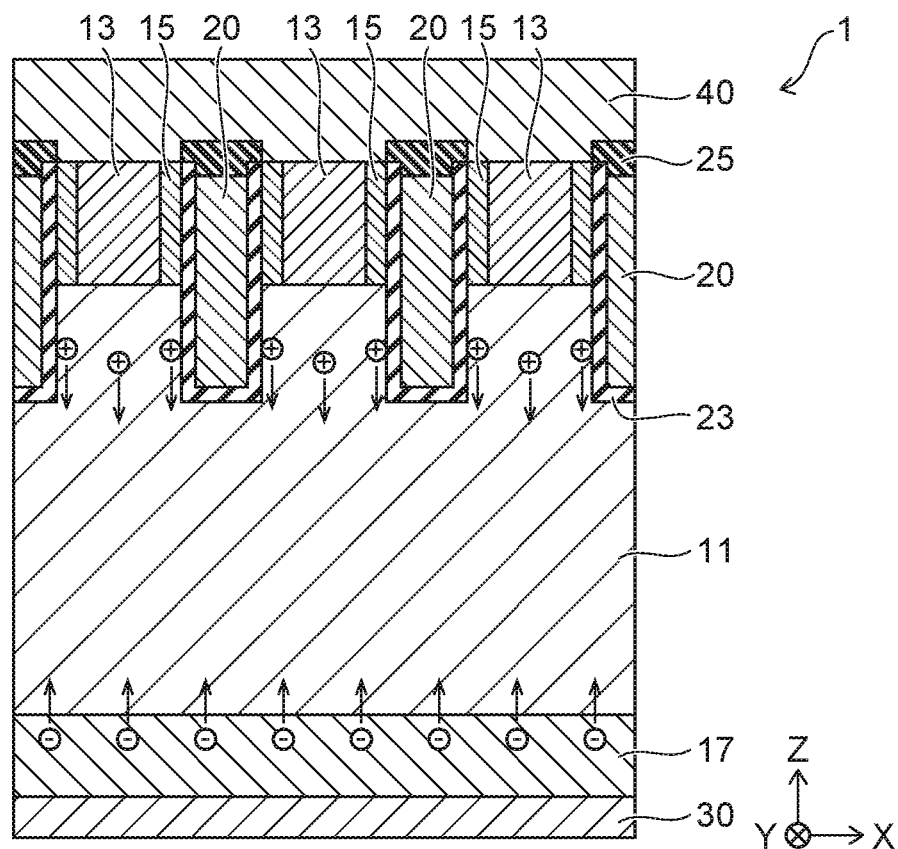
FIGS. 3A and 3B are schematic cross-sectional views showing operations of the semiconductor device according to the embodiment.
Figure 3B:
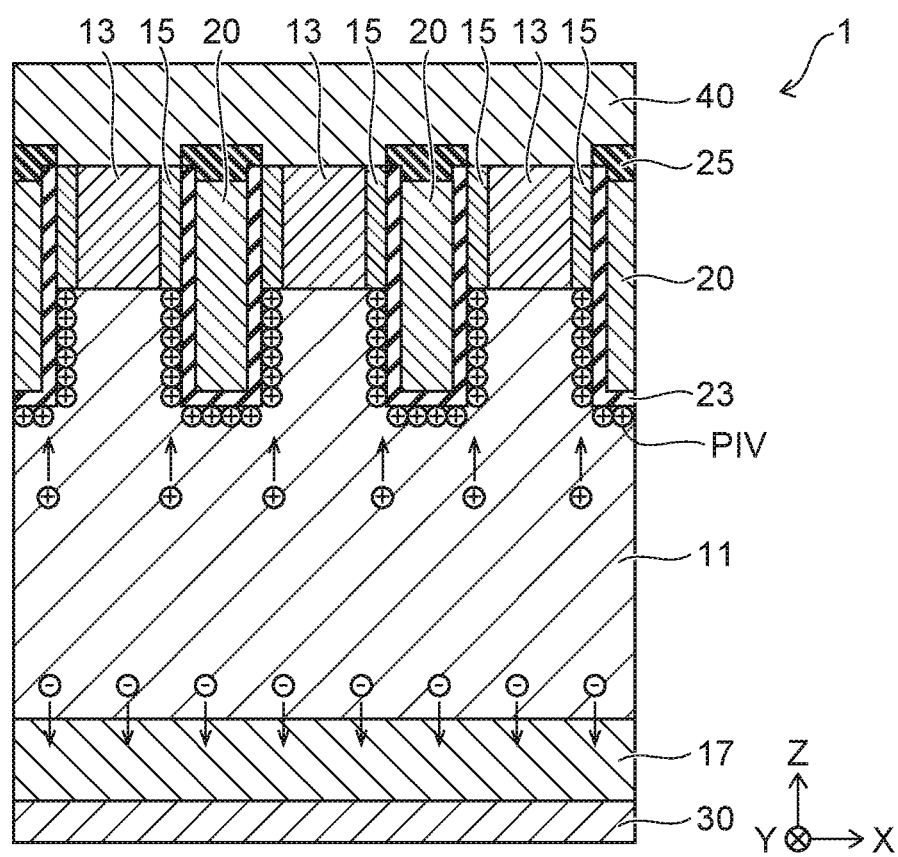

FIGS. 3A and 3B are schematic cross-sectional views showing operations of the semiconductor device 1 according to the embodiment. FIG. 3A shows the flow of the carriers (the electrons and the holes) when the potential of the first electrode 30 is less than the potential of the second electrode (i.e., the on-state). FIG. 3B shows the flow of the carriers when the potential of the first electrode 30 is biased to be greater than the potential of the second electrode 40 (i.e., when recovering from the on-state to the off-state).

As shown in FIG. 3A, electrons are injected from the first electrode 30 into the n-type semiconductor layer 11 via the n-type semiconductor layer 17. Accordingly, holes are injected from the second electrode 40 into the n-type semiconductor layer 11 via the p-type semiconductor layer 13 and the p-type semiconductor layer 15.

In the example, the hole injection from the second electrode 40 into the p-type semiconductor layer 13 is suppressed, because a Schottky barrier exists at the interface between the p-type semiconductor layer 13 and the second electrode 40. Therefore, the holes are mainly injected from the second electrode 40 into the p-type semiconductor layer 15, and then, injected into the n-type semiconductor layer 11 from the p-type semiconductor layers 13 and 15.

Thus, the amount of the holes injected from the second electrode 40 into the n-type semiconductor layer 11 is reduced, and thereby, the amount of the electrons injected from the first electrode 30 into the n-type semiconductor layer 11 also is reduced. Thereby, in the on-state, the carrier densities can be suppressed in the n-type semiconductor layer 11, for example, in the anode region at the second electrode 40 side and in the cathode region at the first electrode 30 side.

As shown in FIG. 3B, while recovering, a negative control voltage, e.g., negative 15 V is applied between the control electrode 20 and the second electrode 40. Thereby, a p-type inversion layer PIV is induced between the n-type semiconductor layer 11 and the insulating film 23.

As shown in FIG. 3B, the electrons inside the n-type semiconductor layer 11 are ejected into the first electrode 30 via the n-type semiconductor layer 17. The holes inside the n-type semiconductor layer 11 are ejected into the second electrode 40 mainly via the p-type inversion layer PIV and the p-type semiconductor layer 15.

In the example, by inducing the p-type inversion layer PIV, the hole ejection path is formed from the n-type semiconductor layer 11 to the second electrode 40, thereby promoting the hole ejection. In the on-state of the semiconductor device 1, the carrier density is suppressed in the n-type semiconductor layer 11, and then, the hole ejection is promoted by the p-type inversion layer PIV while recovering to the off-state. Thereby, it is possible to shorten the recovery time, and reduce the recovery loss.

Further, the holes can be ejected smoothly into the second electrode 40, which are generated by an avalanche phenomenon due to the electric field concentrated at around the lower end of the control electrode 20, because the hole ejection path is formed at the interface between the n-type semiconductor layer 11 and the insulating film 23. Thus, in the semiconductor device 1, the avalanche breakdown immunity is increased, and the safe operation region can be widened while the recovering.

Figure 4A:
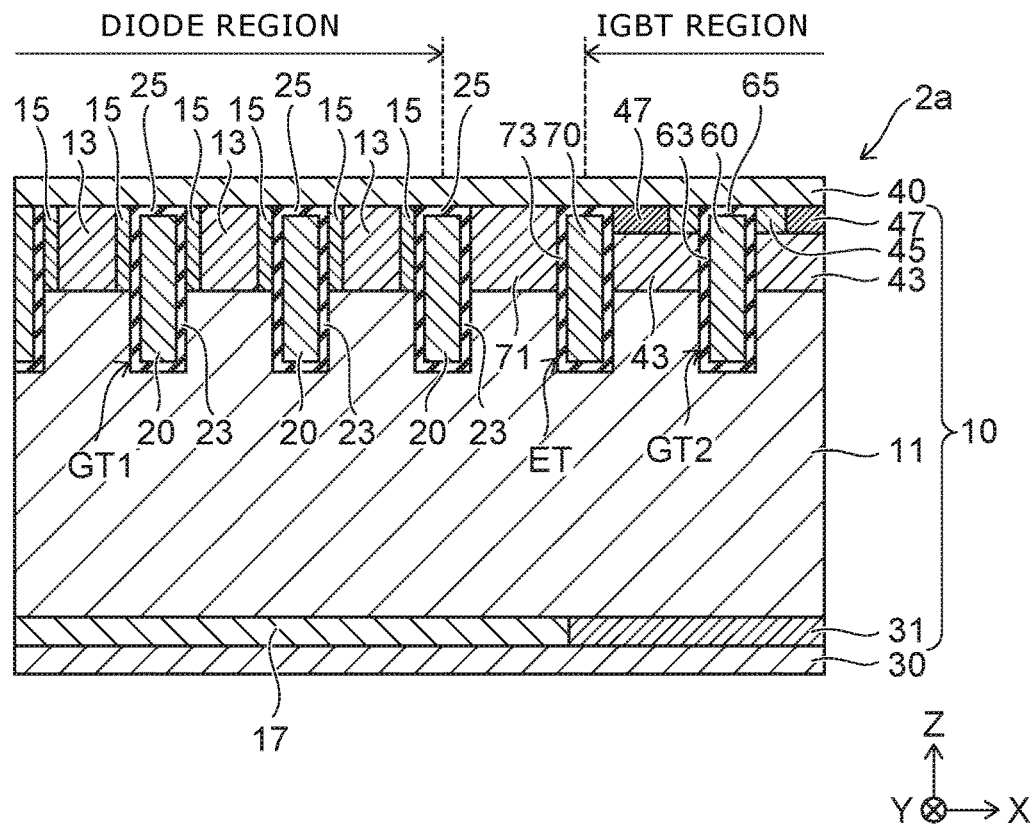
FIGS. 4A and 4B are schematic cross-sectional views showing semiconductor devices according to modifications of the embodiment.
Figure 4B:
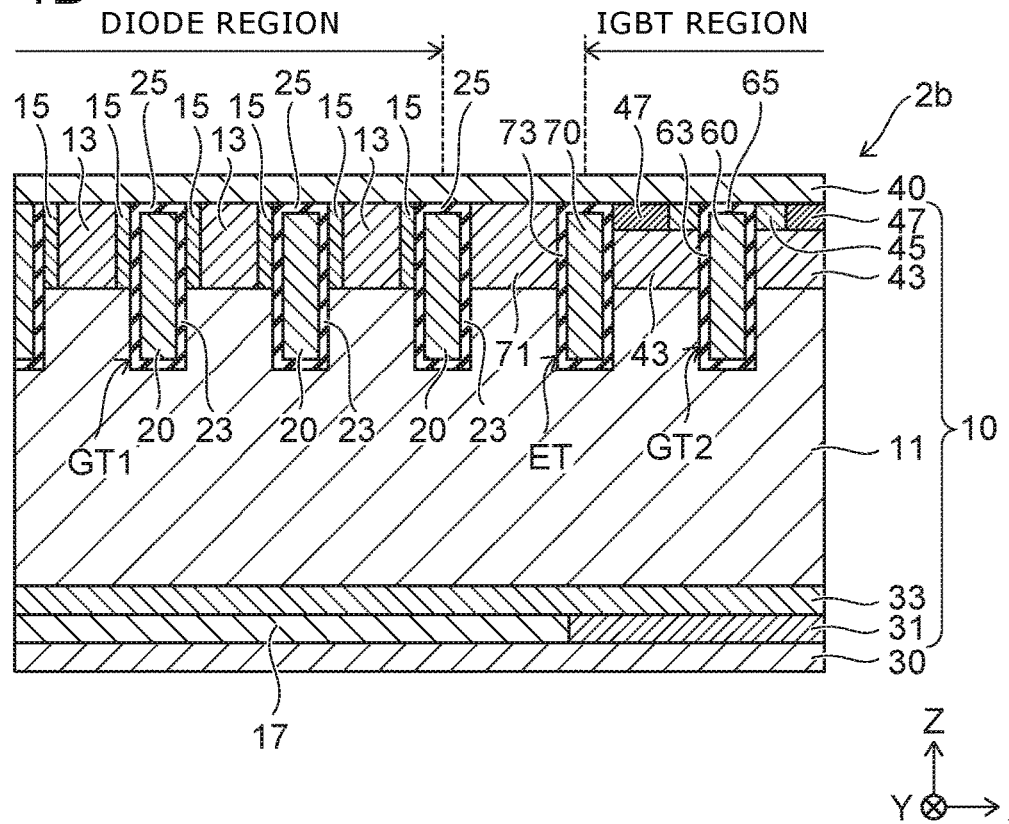

FIGS. 4A and 4B are schematic cross-sectional views showing semiconductor devices 2a and 2b according to modifications of the embodiment. The semiconductor devices 2 have structures in which an IGBT and a diode are integrated.

As shown in FIG. 4A, the semiconductor device 2a includes a diode region and an IGBT region. The semiconductor device 2 includes the control electrode 20 provided in the diode region, a control electrode 60 provided in the IGBT region, and a third electrode 70.

The control electrode 20 is disposed between the semiconductor part 10 and the second electrode 40 inside a gate trench GT1 provided in the semiconductor part 10.

The control electrode 60 is disposed between the semiconductor part 10 and the second electrode 40 inside a gate trench GT2 provided in the semiconductor part 10. The control electrode 60 is electrically insulated from the semiconductor part 10 by an insulating film 63. The control electrode 60 also is electrically insulated from the second electrode 40 by an insulating film 65.

The third electrode 70 is provided at an end of the IGBT region. The third electrode 70 is disposed between the semiconductor part 10 and the second electrode 40 inside a trench ET provided in the semiconductor part 10. The third electrode 70 is electrically insulated from the semiconductor part 10 by an insulating film 73. The third electrode 70 is electrically connected to the second electrode 40.

In the diode region, the semiconductor part 10 includes the n-type semiconductor layer 11, the p-type semiconductor layer 13, the p-type semiconductor layer 15 and the n-type semiconductor layer 17. The p-type semiconductor layer 13, the p-type semiconductor layer 15 and the n-type semiconductor layer 17 are disposed similarly to those in the semiconductor device 1 shown in FIG. 1.

In the IGBT region, the semiconductor part 10 further includes a p-type semiconductor layer 31, a p-type semiconductor layer 43, an n-type semiconductor layer 45 and a p-type semiconductor layer 47.

The p-type semiconductor layer 31 is provided between the n-type semiconductor layer 11 and the second electrode 40. The p-type semiconductor layer 31 is, for example, a p-type collector layer. The p-type semiconductor layer 31 is electrically connected to the first electrode 30.

The p-type semiconductor layer 43 is provided between the n-type semiconductor layer 11 and the second electrode 40. The p-type semiconductor layer 43 is, for example, a p-type base layer.

The n-type semiconductor layer 45 is selectively provided between the p-type semiconductor layer 43 and the second electrode 40. The n-type semiconductor layer 45 is provided such as contacting the insulating film 63. The n-type semiconductor layer 45 includes an n-type impurity with a higher concentration than the concentration of the n-type impurity of the n-type semiconductor layer 11.

The p-type semiconductor layer 47 is selectively provided between the p-type semiconductor layer 43 and the second electrode 40. The p-type semiconductor layer 47 includes a p-type impurity with a higher concentration than the concentration of the p-type impurity in the p-type semiconductor layer 43.

For example, the second electrode 40 is in contact with the n-type semiconductor layer 45 and the p-type semiconductor layer 47, and electrically connected thereto.

The semiconductor part 10 further includes a p-type semiconductor layer 71. The p-type semiconductor layer 71 is provided in an intermediate region between the diode region and the IGBT region. The p-type semiconductor layer 71 is provided between the n-type semiconductor layer 11 and the second electrode 40. The p-type semiconductor layer 71 is provided between the control electrode 20 positioned at an end of the diode region and the third electrode 70 positioned at an end of the IGBT region.

As shown in FIG. 4B, the semiconductor device 2b further includes an n-type semiconductor layer 33. The n-type semiconductor layer 33 is provided between the n-type semiconductor layer 11 and the p-type semiconductor layer 31 and between the n-type semiconductor layer 11 and the n-type semiconductor layer 17. The n-type semiconductor layer 33 is, for example, an n-type buffer layer. The n-type semiconductor layer 33 includes an n-type impurity with a higher concentration than the concentration of the n-type impurity in the n-type semiconductor layer 11. For example, the n-type semiconductor layer 33 includes an n-type impurity with a lower concentration than the concentration of the n-type impurity in the n-type semiconductor layer 17.

The n-type semiconductor layer 17 and the p-type semiconductor layer 31 are positioned at the same level in the Z-direction. The boundary between the n-type semiconductor layer 17 and the p-type semiconductor layer 31 is positioned at the intermediate region between the diode region and the IGBT region.

The semiconductor devices 2a and 2b each operate as the IGBT while the first electrode 30 is biased to a potential greater than the potential of the second electrode 40. On the other hand, the semiconductor devices 2a and 2b each operate as so-called the freewheeling diode while the first electrode 30 is biased to a potential less than the potential of the second electrode 40.

Because the p-type semiconductor layer 13 and the p-type semiconductor layer 15 that contact the second electrode 40 are included in the semiconductor devices 2a and 2b, the switching loss (i.e., the recovery loss) can be reduced while recovering from the diode mode to the IGBT mode. Also, by the control electrode 20 appropriately controlled, the recovery loss can be reduced further, and the avalanche breakdown immunity can be increased while the recovering.

Figure 5A:
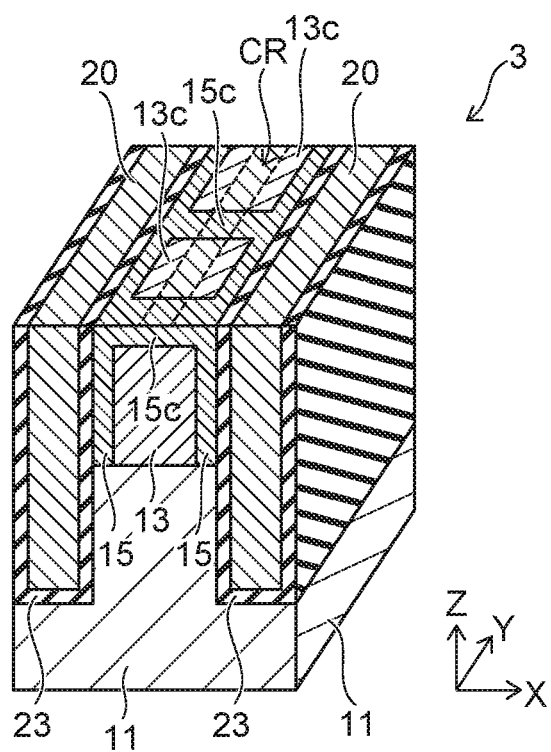
FIGS. 5A and 5B are schematic views showing a semiconductor device according to another modification of the embodiment.
Figure 5B:
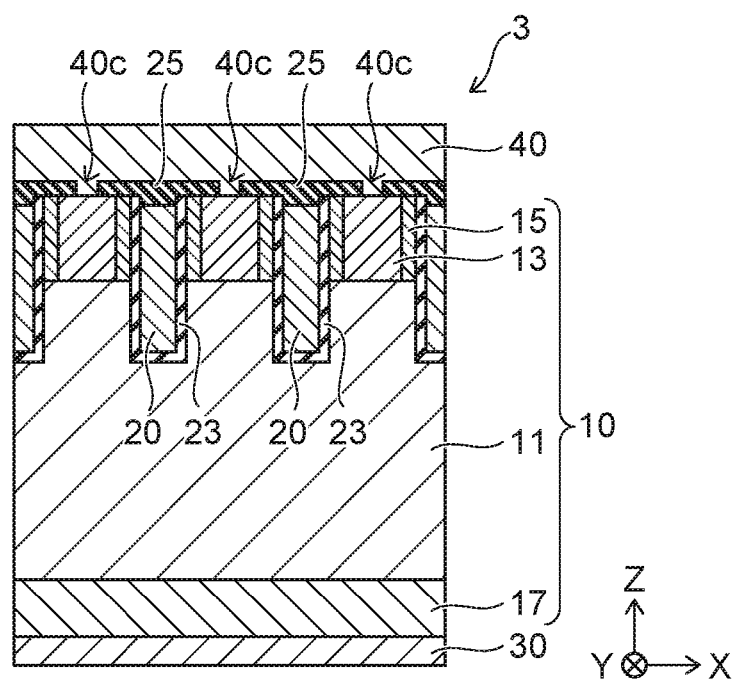

FIGS. 5A and 5B are schematic views showing a semiconductor device 3 according to another modification of the embodiment. FIG. 5A is a perspective view showing the semiconductor device 3. FIG. 5B is a schematic view showing a cross section parallel to the X-Z plane of the semiconductor device 3.

As shown in FIG. 5A, in the semiconductor device 3, the p-type semiconductor layer 13 and the p-type semiconductor layer 15 also are provided between mutually-adjacent control electrodes 20. The p-type semiconductor layer 13 and the p-type semiconductor layer 15 are provided on the n-type semiconductor layer 11. The p-type semiconductor layer 13 includes multiple contact portions 13c. The p-type semiconductor layer 15 includes a contact portion 15c.

The contact portions 13c of the p-type semiconductor layer 13 are arranged in the extension direction of the control electrode 20 (e.g., the Y-direction). The contact portion 15c of the p-type semiconductor layer 15 is provided between mutually-adjacent contact portions 13c.

The second electrode 40 contacts the p-type semiconductor layer 13 and the p-type semiconductor layer 15 in a contact region CR that is surrounded with broken lines shown in FIG. 5A. In other words, the second electrode 40 is connected to the p-type semiconductor layer 13 via the multiple contact portions 13c and connected to the p-type semiconductor layer 15 via the contact portion 15c.

As shown in FIG. 5A, the depth in the Z-direction of the contact portion 15c is less than the depth in the Z-direction from the front surface of the semiconductor part 10 to the boundary between the n-type semiconductor layer 11 and the p-type semiconductor layer 13. Here, the depth in the Z-direction of the contact portion 15c is a distance from the front surface of the semiconductor part 10 to the boundary between the p-type semiconductor layer 13 and the contact portion 15c As shown in FIG. 5B, the second electrode 40 is connected to the p-type semiconductor layer 13 and the p-type semiconductor layer 15 via a connection portion 40c extending through a contact hole provided in the insulating film 25.

For example, when the width in the X-direction of the p-type semiconductor layer 15 is narrow, it is difficult to connect the connection portion 40c to the p-type semiconductor layer 15. In the example, the electrical connection between the p-type semiconductor layer 15 and the second electrode 40 is made easy by connecting the connection portion 40c to the contact portion 15c that is provided in the p-type semiconductor layer 15.

The embodiment is not limited to the contact region CR shown in FIG. 5A; for example, the width in the X-direction of the contact region CR may be widened so that the second electrode 40 also contacts the p-type semiconductor layer 15 at the portion provided between the insulating film 23 and the contact portions 13c.

Second Embodiment

Figure 6:
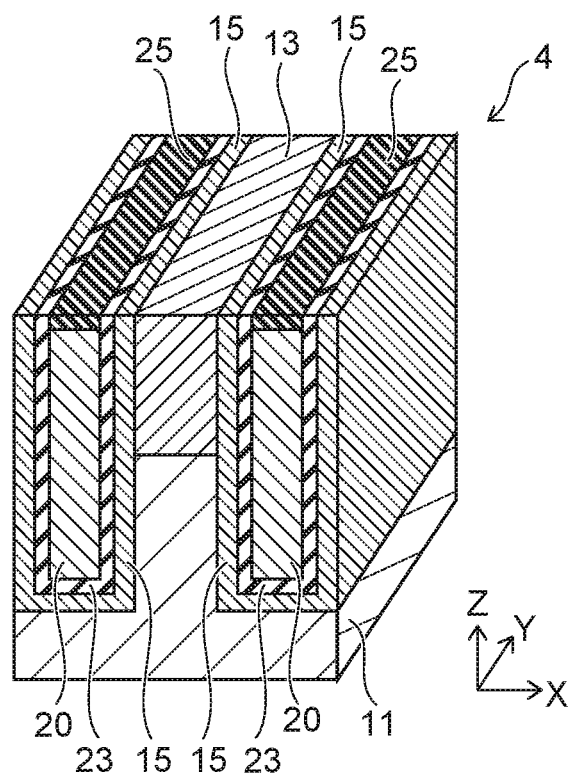
FIG. 6 is a perspective view schematically showing a semiconductor device according to a second embodiment.

FIG. 6 is a perspective view schematically showing a semiconductor device 4 according to a second embodiment.

As shown in FIG. 6, the p-type semiconductor layer 13 is provided on the n-type semiconductor layer 11 between mutually-adjacent control electrodes 20.

The p-type semiconductor layer 15 extends along the insulating film 23. The p-type semiconductor layer 15 faces the side surface and the bottom surface of the control electrode via the insulating film 23. The p-type semiconductor layer includes a portion extending between the p-type semiconductor layer 13 and the insulating film 23, and another portion extending between the n-type semiconductor layer 11 and the insulating film 23.

The p-type semiconductor layer 15 includes a p-type impurity with a higher concentration than the concentration of the p-type impurity in the p-type semiconductor layer 13. For example, the second electrode 40 has an ohmic connection with the p-type semiconductor layer 15 (referring to FIG. 2A). For example, the second electrode 40 has a Schottky connection with the p-type semiconductor layer 13.

Also, in the example, by suppressing the hole injection from the second electrode 40 into the p-type semiconductor layer 13, the carrier density in the n-type semiconductor layer 11 can be lowered in the on-state, and the recovery time can be shortened. The p-type semiconductor layer 15 also becomes an ejection path of the holes from the n-type semiconductor layer 11 to the second electrode 40 when recovering from the on-state to the off-state. Thereby, the recovery time can be shortened further, and the switching loss can be reduced.

In the example, it is unnecessary to induce the p-type inversion layer PIV (referring to FIG. 3B) by applying a negative control voltage to the control electrode 20, and thus, the circuit supplying the control voltage to the control electrode 20 has a simplified configuration (not illustrated). The control electrode may be electrically connected to the second electrode 40, and set to the same potential as the second electrode 40.

Figure 7A:
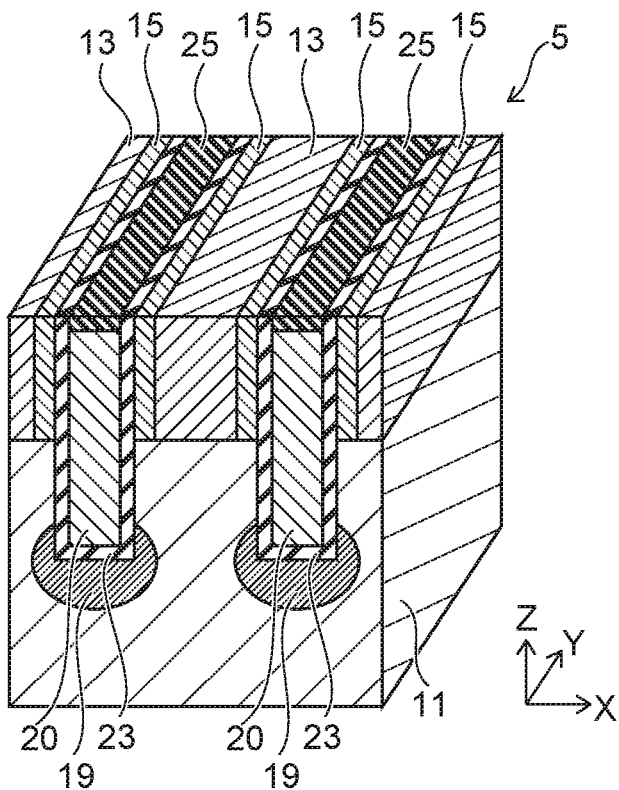
FIGS. 7A and 7B are schematic views showing a semiconductor device according to a modification of the second embodiment.
Figure 7B:
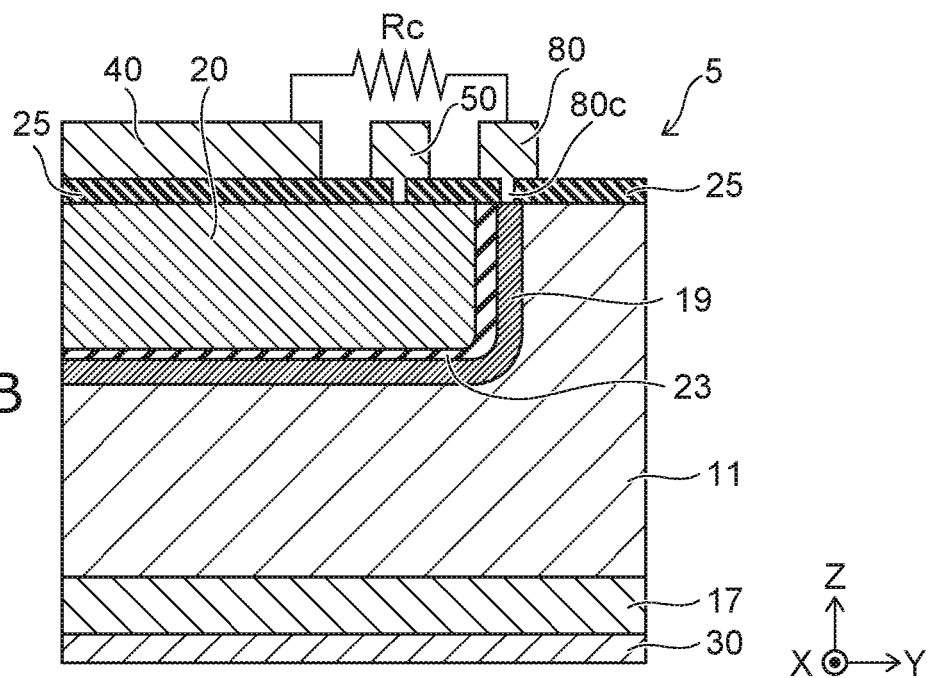

FIGS. 7A and 7B are schematic views showing a semiconductor device 5 according to a modification of the second embodiment. FIG. 7A is a perspective view showing the semiconductor device 5. FIG. 7B is a schematic view showing a cross section parallel to the Y-Z plane of the semiconductor device 5.

As shown in FIG. 7A, the p-type semiconductor layer 13 and the p-type semiconductor layer 15 are provided on the n-type semiconductor layer 11 between mutually-adjacent control electrodes 20. The control electrode 20 is electrically insulated from the semiconductor part 10 (referring to FIG. 2A) by the insulating film 23, and the p-type semiconductor layer is provided between the p-type semiconductor layer 13 and the insulating film 23.

The semiconductor part 10 further includes a p-type semiconductor layer 19. The p-type semiconductor layer 19 faces the lower end of the control electrode 20 via the insulating film 23. The control electrode 20 is electrically insulated from the p-type semiconductor layer 19 by the insulating film 23. The p-type semiconductor layer 19 is provided apart from the p-type semiconductor layer 13 and the p-type semiconductor layer 15.

As shown in FIG. 7B, the control electrode 20 extends in the Y-direction. The control electrode 20 is electrically connected to the gate interconnect 50 at the end of the control electrode 20. The p-type semiconductor layer 19 also extends in the Y-direction and faces the control electrode 20 via the insulating film 23. The control electrode 20 is not limited to the example; for example, the control electrode 20 may be electrically connected to the second electrode 40 (the anode electrode) without providing the gate interconnect 50.

The p-type semiconductor layer 19 extends in the Z-direction along the end of the control electrode 20. The p-type semiconductor layer 19 is electrically connected to an interconnect 80. The interconnect 80 includes a contact portion 80c that extends through a contact hole provided in the insulating film 25 and contacts the p-type semiconductor layer 19, The interconnect 80 is electrically connected to the second electrode 40 via a resistance Rc. That is, the p-type semiconductor layer 19 is electrically connected to the second electrode 40 via the resistance Rc. Alternatively, the p-type semiconductor layer 19 may have a floating potential.

In the example, a negative control voltage is applied between the control electrode 20 and the second electrode 40 when recovering to the off-state from the on-state. The p-type semiconductor layer 15 and the p-type semiconductor layer 19 are connected by the p-type inversion layer (referring to FIG. 33) induced at the interface between the n-type semiconductor layer 11 and the insulating film 23. Thereby, an ejection path of holes is formed from the n-type semiconductor layer 11 into the second electrode 40, and the recovery time can be shortened to reduce the switching loss (the recovery loss). Also, the holes that are generated by the avalanche phenomenon due to the electric field concentrated at the lower end of the control electrode 20 can be ejected smoothly into the second electrode 40, and the avalanche breakdown immunity can be increased while the recovering.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a trench at a front surface side;
a first electrode provided on a back surface of the semiconductor part;
a second electrode provided on the front surface of the semiconductor part; and
a control electrode provided between the semiconductor part and the second electrode, the control electrode being provided in the trench of the semiconductor part, the control electrode being electrically insulated from the semiconductor part by a first insulating film and electrically insulated from the second electrode by a second insulating film,
the semiconductor part including a first semiconductor layer of a first conductivity type, a second semiconductor layer of a second conductivity type, and a third semiconductor layer of the second conductivity type,
the first semiconductor layer extending between the first and second electrodes, the control electrode extending into the first semiconductor layer from the front surface side of the semiconductor part,
the second semiconductor layer being provided between the first semiconductor layer and the second electrode, the second semiconductor layer being connected to the second electrode,
the third semiconductor layer also being provided between the first semiconductor layer and the second electrode, the third semiconductor layer contacting the first semiconductor layer and being connected to the second electrode, the third semiconductor layer including a second-conductivity-type impurity with a higher concentration than a concentration of a second-conductivity-type impurity in the second semiconductor layer,
the third semiconductor layer being provided between the second semiconductor layer and the control electrode, the third semiconductor layer contacting the first insulating film and the second semiconductor layer.

2. The device according to claim 1, wherein
the second semiconductor layer includes a plurality of contact portions contacting the second electrode, the plurality of contact portions being arranged in an extension direction of the control electrode along the front surface of the semiconductor part,
the third semiconductor layer further includes a contact portion contacting the second electrode, and
the contact portion of the third semiconductor layer is provided between the adjacent contact portions of the plurality of contact portions of the second semiconductor layer.

3. The device according to claim 1, wherein
the second semiconductor layer includes a plurality of contact portions arranged in an extension direction of the control electrode along the front surface of the semiconductor part,
the third semiconductor layer includes a first portion and a second portion, the first portion being provided between the second semiconductor layer and the first insulating film, the second portion being provided between the adjacent contact portions of the plurality of contact portions of the second semiconductor layer, and
the second electrode contacts the plurality of contact portions of the second semiconductor layer and the first and second portions of the third semiconductor layer.

4. The device according to claim 2, wherein
the second semiconductor layer has a first thickness in a first direction, the first direction being from the first electrode toward the second electrode, and
the contact portion of the third semiconductor layer has a second thickness in the first direction, the first thickness being greater than the second thickness.

5. The device according to claim 1, wherein
the second semiconductor layer has a first thickness in a first direction, the first direction being from the first electrode toward the second electrode, and
the third semiconductor layer has a first length in the first direction, the first thickness being substantially equal to the first length.

6. The device according to claim 1, wherein
the third semiconductor layer includes a portion extending along the first insulating film, the portion being provided between the first semiconductor layer and the first insulating film.

7. The device according to claim 1, wherein
the third semiconductor layer has a first layer thickness in a second direction, the second direction being from the second semiconductor layer toward the control electrode, and
the second semiconductor layer has a first width in the second direction, the first layer thickness being less than the first width.

8. The device according to claim 7, wherein
the third semiconductor layer has a first length along the first insulating film in a direction from the first electrode toward the second electrode, and
the first length is greater than the first layer thickness.

9. The device according to claim 1, wherein
the semiconductor part further includes a fourth semiconductor layer of the first conductivity type provided between the first semiconductor layer and the first electrode, the fourth semiconductor layer including a first-conductivity-type impurity with a higher concentration than a concentration of a first-conductivity-type impurity in the first semiconductor layer.

10. The device according to claim 1, wherein
the semiconductor part further includes a fifth semiconductor layer of the second conductivity type provided between the first semiconductor layer and the first insulating film, the fifth semiconductor extending along a bottom portion of the trench to cover an end of the control electrode.

11. The device according to claim 10, wherein
the fifth semiconductor layer is connected to the second electrode via an electrical resistance.

12. The device according to claim 1, further comprising an interconnect provided on the front surface of the semiconductor part, the interconnect being provided apart from the second electrode, the interconnect being electrically insulated from the semiconductor part by the second insulating film and electrically connected to the control electrode.

* * * * *